(12) United States Patent
Furuya et al.

(10) Patent No.: US 7,848,716 B2
(45) Date of Patent: Dec. 7, 2010

(54) SEMICONDUCTOR INTEGRATED CIRCUIT FOR COMMUNICATION

(75) Inventors: Ryoji Furuya, Takasaki (JP); Kazuhisa Okada, Takasaki (JP); Hiroaki Matsui, Takasaki (JP)

(73) Assignee: Renesas Electronics Corporation, Kawasaki (JP)

(*) Notice: Subject to any disclaimer, the term of this patent is extended or adjusted under 35 U.S.C. 154(b) by 1323 days.

(21) Appl. No.: 11/360,424

(22) Filed: Feb. 24, 2006

(65) Prior Publication Data
US 2006/0194606 A1 Aug. 31, 2006

(30) Foreign Application Priority Data
Feb. 28, 2005 (JP) ............................. 2005-052288

(51) Int. Cl.
H04B 1/04 (2006.01)
H04B 1/00 (2006.01)

(52) U.S. Cl. ................. 455/114.2; 455/63.1; 455/115.1; 455/333; 375/296

(58) Field of Classification Search ................. 455/63.1, 455/67.11, 67.13, 110, 112, 114.2, 114.3, 455/115.1, 131, 313, 333, 552.1, 553.1; 375/296, 375/303, 322
See application file for complete search history.

(56) References Cited

U.S. PATENT DOCUMENTS

| | | |
|---|---|---|
| 4,717,894 A | 1/1988 | Edwards et al. |
| 6,763,227 B2* | 7/2004 | Kramer ................. 455/115.1 |
| 7,039,382 B2* | 5/2006 | Shu ........................ 455/313 |
| 7,259,569 B2* | 8/2007 | Kim ........................ 324/601 |
| 7,496,343 B2* | 2/2009 | Khorram ................. 455/326 |
| 7,660,563 B2* | 2/2010 | Gehring et al. .......... 455/115.1 |

FOREIGN PATENT DOCUMENTS

| | | |
|---|---|---|
| EP | 1 011 192 A2 | 6/2000 |
| JP | 5-327682 A | 12/1993 |
| JP | 7-202961 | 8/1995 |
| JP | 11-205401 | 7/1999 |
| JP | 2003-125014 | 4/2003 |
| WO | WO 00/57545 | 9/2000 |

* cited by examiner

Primary Examiner—Quochien B Vuong
(74) Attorney, Agent, or Firm—Mattingly & Malur, P.C.

(57) ABSTRACT

The present invention provides a semiconductor integrated circuit for communication (RF IC) realizing high yield without deteriorating a carrier leak characteristic even when a modulation circuit is formed by using cheep parts with large variations. In a semiconductor integrated circuit (RF IC) including: an input circuit constructed by a differential amplifier circuit and a level shifter, which is provided on the ante stage of a mixer of a differential circuit called a Gilbert Cell; and a modulation circuit that performs modulation by adding an I/Q signal and a carrier wave signal, a calibration circuit for canceling a DC offset in an output of the input circuit is provided.

10 Claims, 9 Drawing Sheets

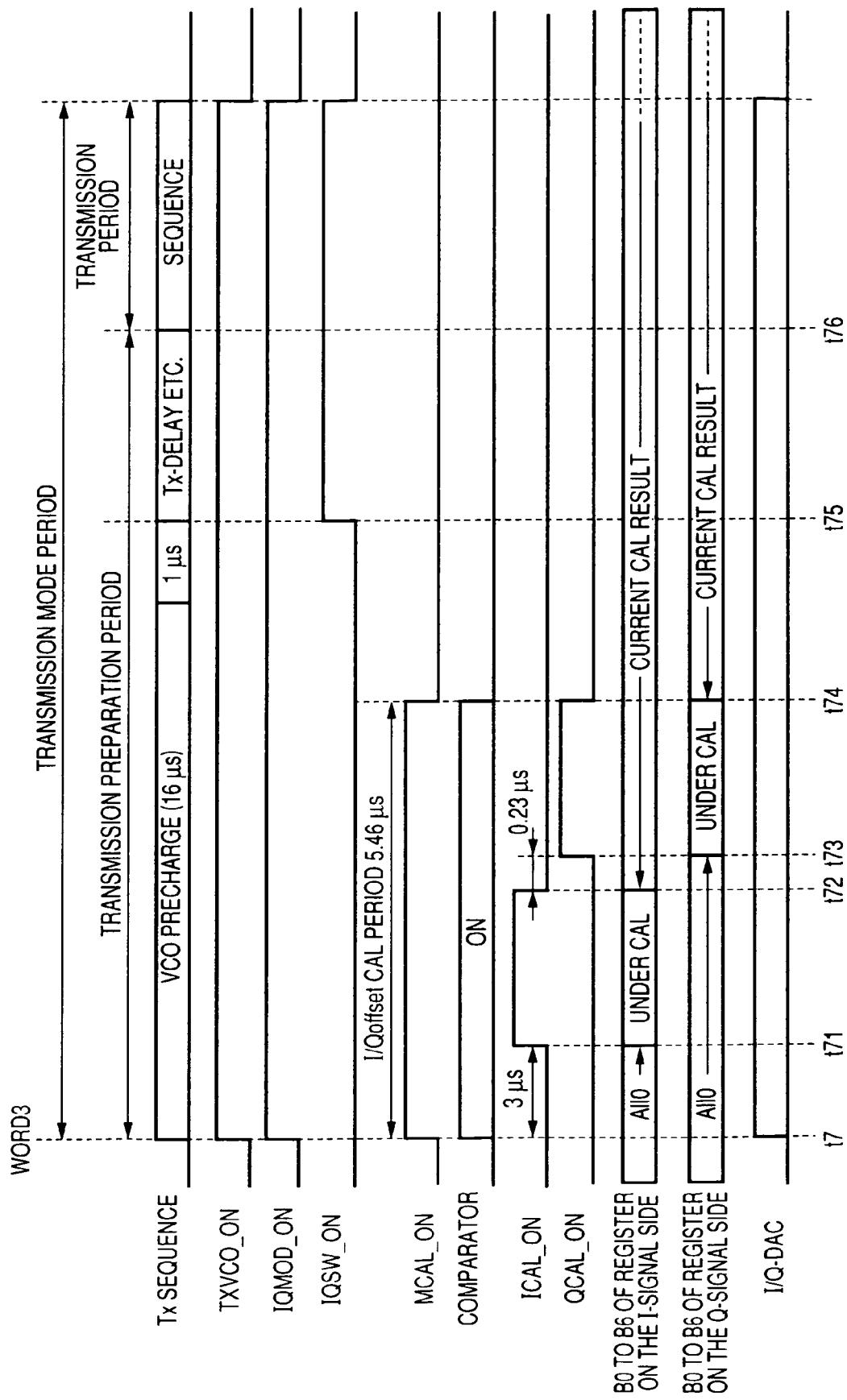

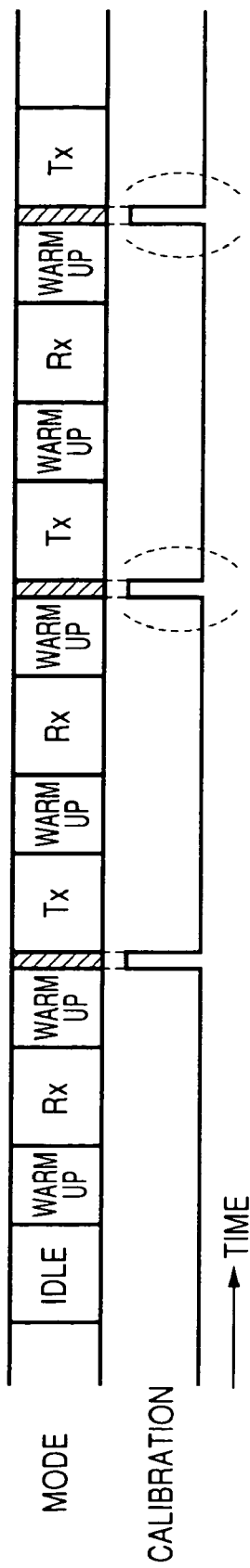
FIG. 10(A) "GSM"
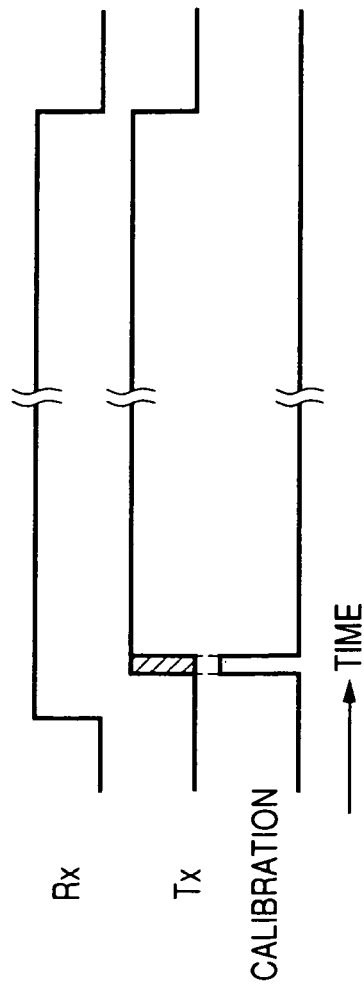
FIG. 10(B) "WCDMA"

US 7,848,716 B2

SEMICONDUCTOR INTEGRATED CIRCUIT FOR COMMUNICATION

CROSS-REFERENCE TO RELATED APPLICATION

The present application claims priority from Japanese patent application No 2005-052288 filed on Feb. 28, 2005, the content of which is hereby incorporated by reference into this application.

BACKGROUND OF THE INVENTION

The present invention relates to a semiconductor integrated circuit for communication having therein a modulation circuit for modulating a carrier wave signal with a transmission baseband signal and, further, to a technique for cancelling a DC offset of a modulation circuit. More particularly, the invention relates to a technique effectively applied to a semiconductor integrated circuit for communication which is mounted on a radio communication system such as a cellular phone having a mode of modulating only a phase component and a mode of modulating a phase component and an amplitude mode.

In a radio communication system such as a cellular phone, a semiconductor integrated circuit for communication (hereinbelow, called an RF IC) is used, which down-converts/up-converts frequencies by mixing a local oscillation signal (carrier wave signal) of high frequencies with a reception signal or a transmission baseband signal by a mixer, modulates a transmission signal, and demodulates a reception signal.

A radio communication system of the GSM (Global System for Mobile Communication) or the like in recent years is being practically used, which has a mode called EDGE (Enhanced Data Rates for GMS Evolution) including not only a GMSK (Gaussian filtered Minimum Shift Keying) modulation mode of modulating a phase component of a carrier wave but also a 3π/8 rotating 8-PSK (Phase Shift Keying) modulation mode of modulating a phase component and an amplitude component of a carrier wave, and which can perform communications while switching the modulation modes. In the EDGE mode, not only phase modulation but also amplitude modulation is performed, so that data communication can be performed at higher speed than the GMSK mode performing only phase modulation.

In recent years, there is a demand for a dual-band cellular phone capable of using not only a signal according to the GSM but also a signal according to the WCDMA (Wideband Code Division Multiple Access) that uses spread spectrum as a multiplex method and uses the QPSK (Quadrature PSK) as a modulation method (Japanese Unexamined Patent Publication No. Hei 11 (1999)-205401).

SUMMARY OF THE INVENTION

The inventors of the present invention have examined a semiconductor integrated circuit for communication having therein a modulation circuit constructed by an NPN bipolar transistor and an MOSFET (Metal Oxide Semiconductor Field Effect Transistor) obtained by eliminating a PNP bipolar transistor from a modulation circuit using the PNP bipolar transistor for passing constant current in order to reduce the cost of a semiconductor integrated circuit for communication for a cellular phone having the function of dealing a signal according to the GSM.

As a result, the inventors have found that the modulation circuit using no PNP bipolar transistor has a problem such the characteristic degradation called a carrier leak occurs conspicuously, and the yield deteriorates. The carrier leak is a problem such that a frequency component of a carrier wave is included in a transmission signal due to a DC offset of the modulation circuit.

The carrier leak caused by the DC offset of the modulation circuit will be described hereinbelow.

FIGS. 3A and 3B show circuits of an input part of a modulation circuit constructed only by NPN bipolar transistors and MOSFETs (transistors) examined by the inventors. The input circuit is used to convert an I signal (an in-phase component for the fundamental wave) or a Q signal (a quadrature component for the fundamental wave) as an input signal to a signal of a level adapted to a mixer in the next stage while amplifying the signal. The input circuit on the I signal side is shown. The input circuit on the Q signal side is the same as that on the I signal side. FIG. 3A shows a circuit using PMOS type bipolar transistors as transistors Q3 and Q4 for constant current, and FIG. 3B shows a circuit using PNP bipolar transistors as the transistors Q3 and Q4.

In the circuit of FIG. 3A, an offset voltage is generated at an input of the mixer in the next stage due to variations in a threshold voltage Vth of a P-type MOSFET. In the circuit 3B, an offset voltage is generated at an input of the mixer in the next stage due to variations in a base-emitter voltage Vbe of a PNP-type bipolar transistor. In the existing semiconductor manufacturing process, the voltage Vth varies more than the voltage Vbe. It is consequently evident that, as shown in FIGS. 4A and 4B, a carrier leak that an input offset voltage of the mixer increases and a frequency component of a carrier wave (carrier signal) as another input of the mixer appears in an output in the case of using the circuit of FIG. 3A is larger than that in the case of using the circuit of FIG. 3B.

FIG. 4A shows a frequency spectrum in the case of using the circuit of FIG. 3A, and FIG. 4B shows a frequency spectrum in the case of using the circuit 3B. In each of FIGS. 4A and 4B, the center wave having the highest peak is a wanted wave, and the wave on the left side of the center wave is a carrier wave. When FIGS. 4A and 4B are compared, it is understood that the component of the carrier wave apart from the wanted wave by, for example, 64 kHz in FIG. 4A is larger than that in FIG. 4B.

The component of the carrier wave is a noise component for the wanted wave. It became evident that if the carrier leak amount as the difference between the wanted wave signal level and the carrier wave signal level is −31 dBc as a specification or less, degradation in the transmission characteristics such as phase accuracy occurs in the case of using the circuit of FIG. 3A.

The present invention has been achieved in the background as described above, and an object of the invention is to provide a semiconductor integrated circuit (RF IC) for communication realizing high yield without deteriorating the carrier leak characteristic even when a modulation circuit is constructed by using cheap parts with large variations.

As a technique of cancelling the DC offset in the modulation circuit, for example, there is the invention disclosed in Japanese Unexamined Patent Publication (JP-A) No. Hei 11(1999)-205401. In the invention of JP-A No. 11(1999)-205401, calibration is performed while sending a predetermined signal from a baseband circuit to a modulation circuit. In contrast, an RF IC of the present invention can perform calibration in itself. The ways of performing the calibration are different from each other. The present invention cannot be easily achieved from the invention of JP-A No. 11-205401.

The above and other objects and novel features of the present invention will become apparent from the description of the specification and the appended drawings.

The outline of a representative one of the inventions disclosed in the specification will be briefly described as follows.

In a semiconductor integrated circuit (RF IC) including: an input circuit constructed by a differential amplifier circuit and a level shifter, which is provided on the ante stage of a mixer of a differential circuit called a Gilbert Cell; and a modulation circuit that performs modulation by adding an I/Q signal (transmission base band signal) and a carrier wave signal, a calibration circuit for canceling a DC offset in the input circuit is provided. Cancellation of the DC offset in the input circuit is performed just before start of transmission.

Since the DC offset in the input circuit can be cancelled by the above-described means, occurrence of a carrier leak in the mixer at the post stage can be avoided, and degradation of the transmission characteristics can be prevented.

The effect obtained by the representative one of the inventions disclosed in the specification will be briefly described as follows.

According to the present invention, a semiconductor integrated circuit (RF IC) realizing high yield without deteriorating the carrier leak characteristic even when a modulation circuit is constructed by using cheap parts with large variations can be realized.

BRIEF DESCRIPTION OF THE DRAWINGS

FIG. 5 is a timing chart showing calibration operation of the modulation circuit of the embodiment.

FIG. 10A is a timing chart showing timings of calibration in the GSM, and FIG. 10B is a timing chart showing timings of calibration in the WCDMA of the RF IC.

DETAILED DESCRIPTION OF THE PREFERRED EMBODIMENTS

An embodiment of the present invention will be described by using the drawings.

Figure 1:
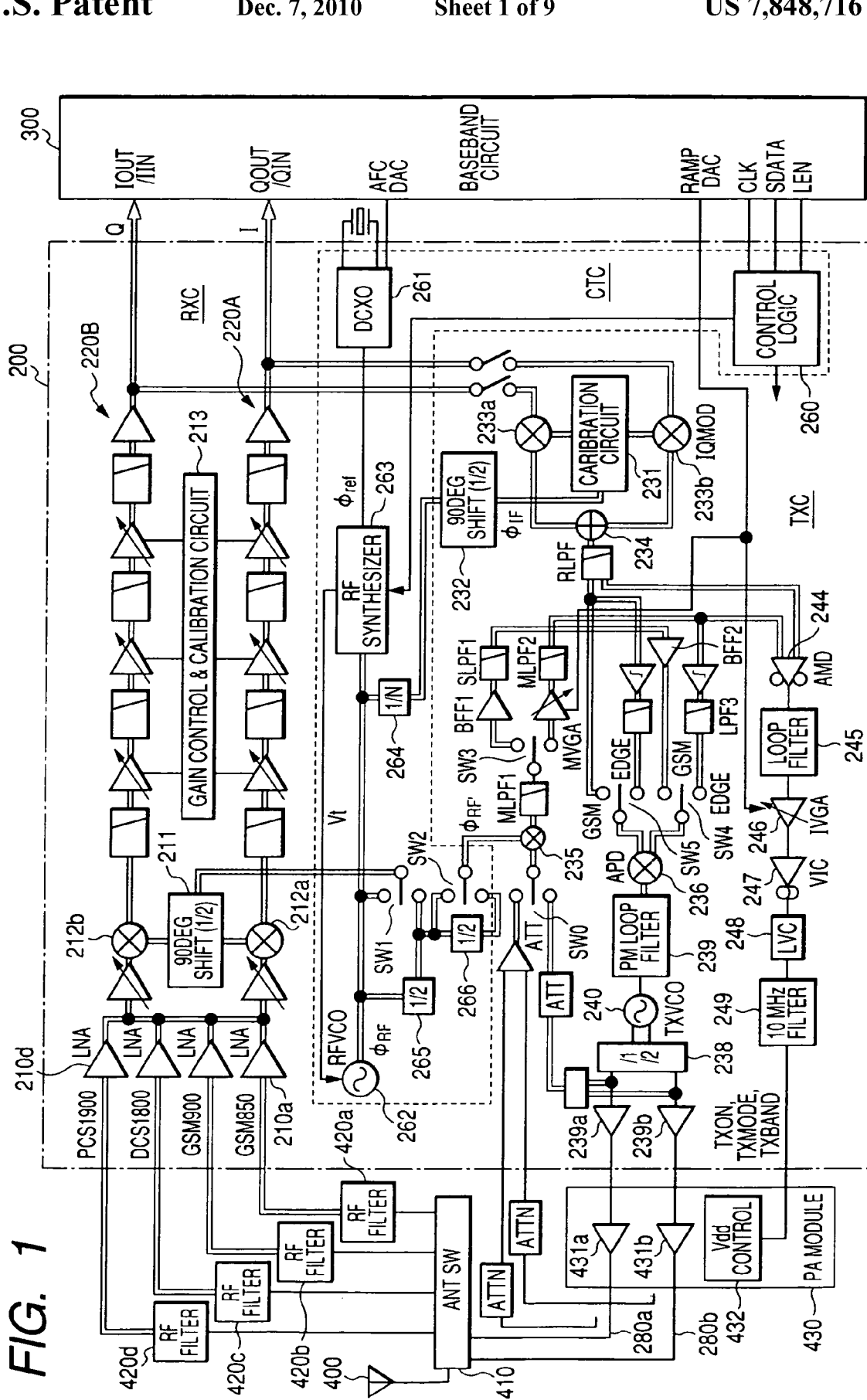
FIG. 1 is a block diagram showing an example of a semiconductor integrated circuit for communication (RF IC) to which the present invention is applied and a communication system using the RF IC.

FIG. 1 shows an example of a semiconductor integrated circuit (RF IC) for communication to which the invention is applied and a radio communication system using the RF IC.

As shown in FIG. 1, the system includes an antenna 400 for transmitting/receiving signal waves, a switch 410 for switching transmission/reception, high frequency filters 420a to 420d each taking the form of an SAW filter or the like for eliminating an unnecessary wave from a reception signal, a radio frequency power amplifier (power module) 430 for amplifying a transmission signal, an RF IC 200 for demodulating a reception signal and modulating a transmission signal, and a baseband circuit 300 for performing a baseband process such as conversion of a sound signal and a data signal to be transmitted into an I signal of an in-phase component and a Q signal of a quadrature component with respect to a fundamental wave, and conversion of demodulated reception I and Q signals into a sound signal and a data signal, and for transmitting a signal for controlling the RF IC 200. Although it is not particularly limited, the RF IC 200 and the baseband circuit 300 are formed as semiconductor integrated circuits on different semiconductor chips.

The RF IC 200 is constructed by, roughly, a reception-related circuit RXC, a transmission-related circuit TXC, and a control-related circuit CTC including circuits common to the transmission and reception systems, such as a control circuit and a clock generation circuit other than the reception-related circuit RXC and the transmission-related circuit TXC. Modulation circuits 233a and 233b as objects of the invention are provided for the transmission-related circuit TXC and perform quadrature modulation by mixing an intermediate frequency signal as a carrier wave signal with the I and Q signals supplied from the baseband circuit 300.

Figure 2:
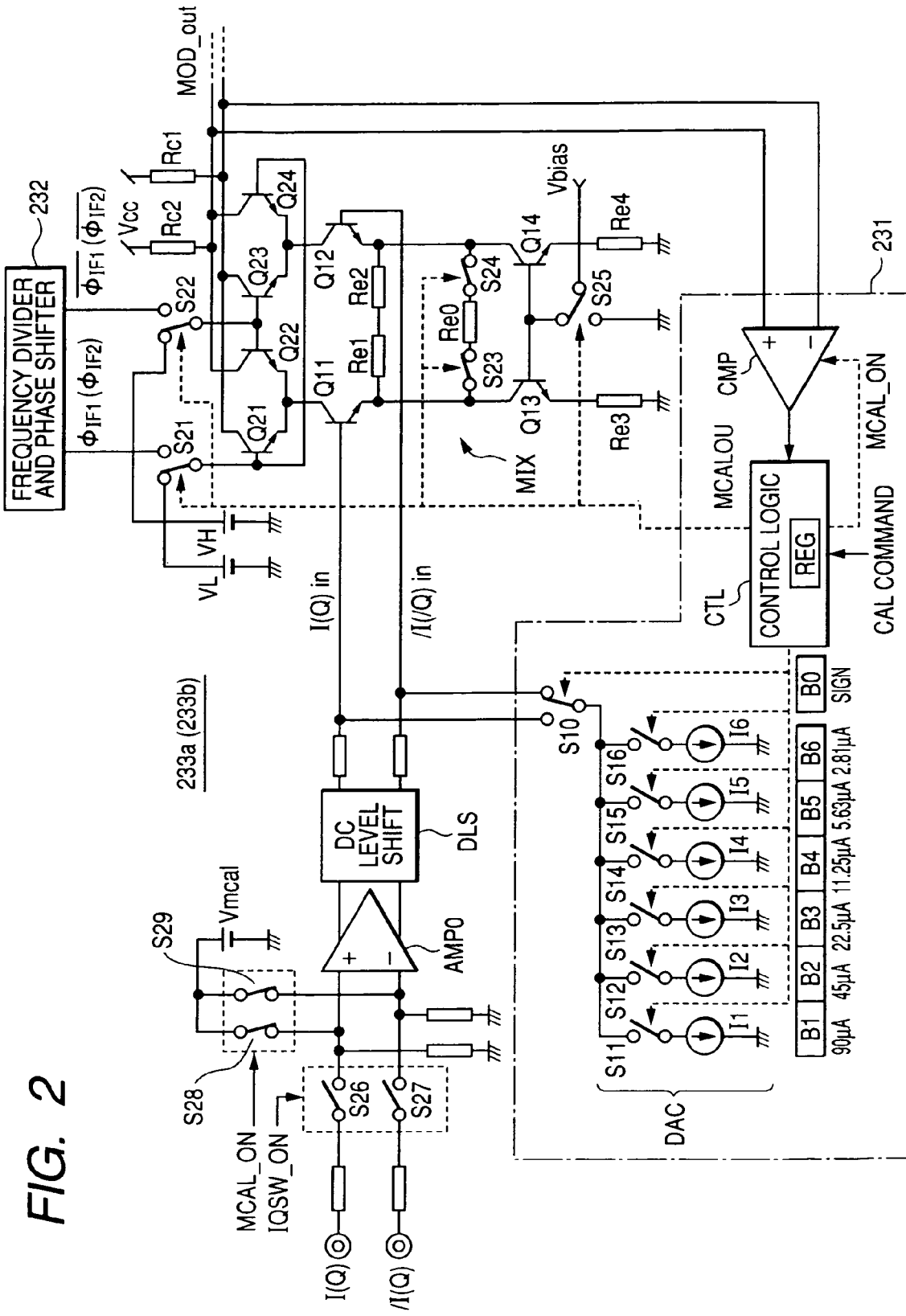
FIG. 2 is a block diagram showing a configuration example of a modulation circuit and a calibration circuit in the RF IC of an embodiment.

First, the modulation circuits 233a and 233b and a calibration circuit 231 for them will be described prior to detailed description of the RF IC 200. FIG. 2 shows a concrete circuit example of the modulation circuits 233a and 233b and the calibration circuit 231 for the modulation circuits 233a and 233b. Since the configuration of the modulation circuit 233a on the I signal side and that of the modulation circuit 233b on the Q signal side are the same, only one of them is shown and the other is not shown.

Figure 3A:
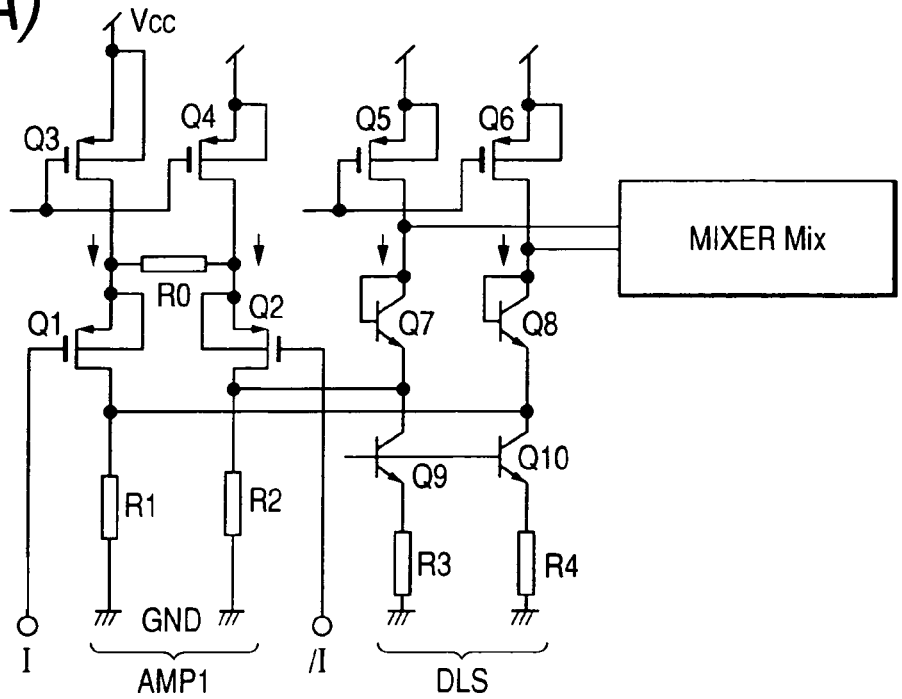
FIG. 3A is a circuit diagram showing a concrete example of a preamplifier and a DC level shifter at the ante stage of a mixer used for the modulation circuit of the embodiment.
Figure 3B:
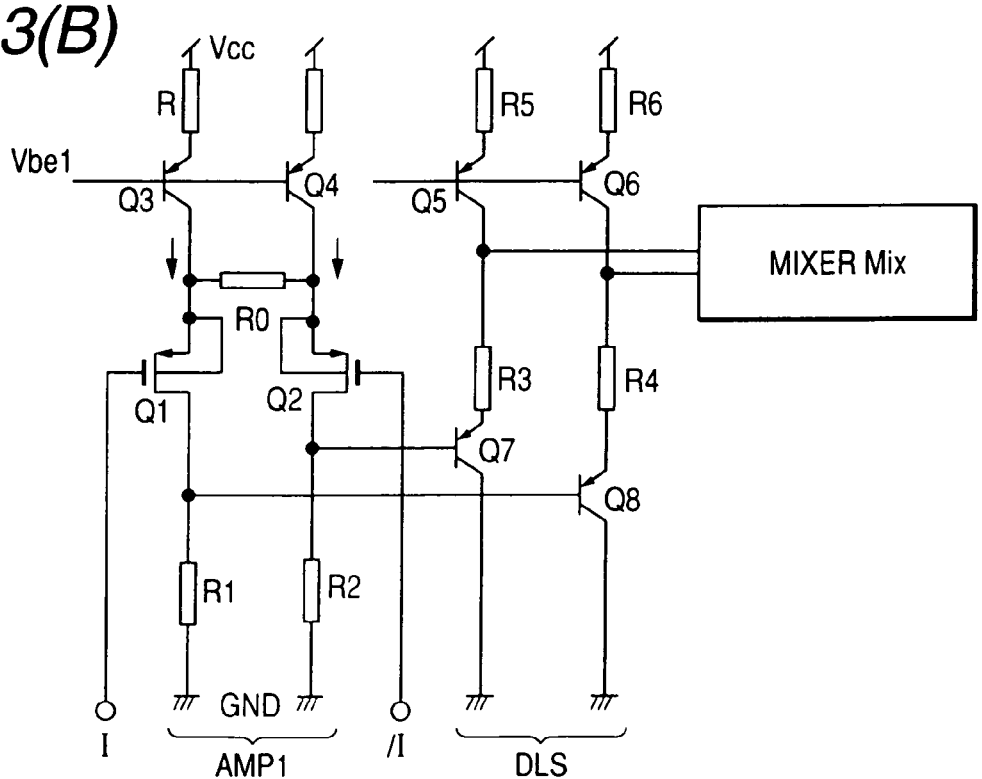
FIG. 3B is a circuit diagram showing an example of a preamplifier and a DC level shifter examined by the inventors of the present invention prior to the present invention.
Figure 4A:
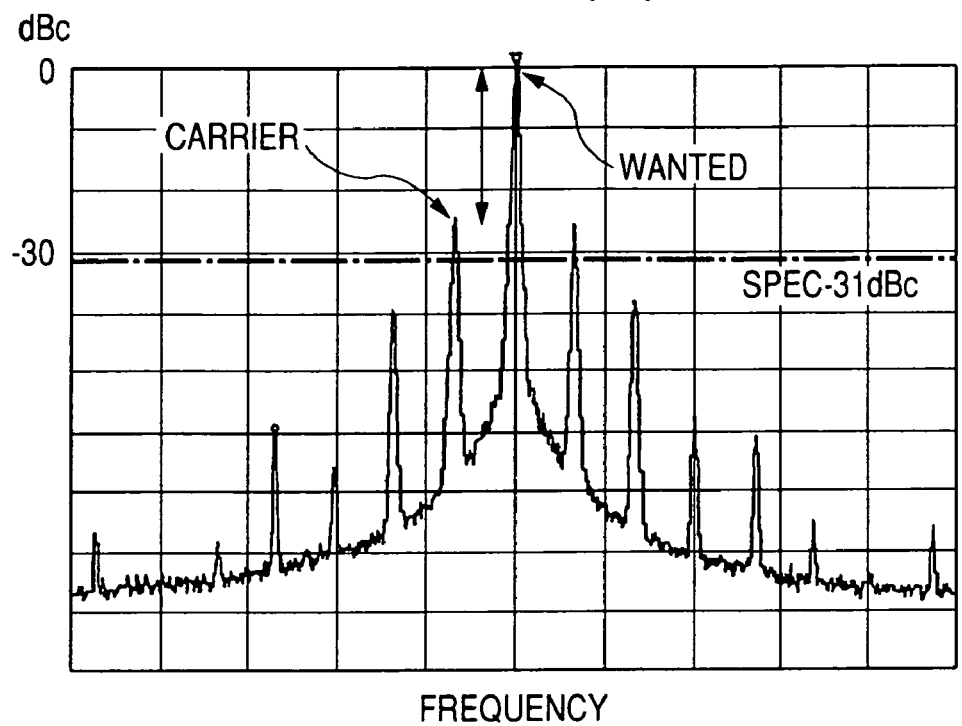
FIG. 4A is a characteristic diagram showing a carrier leak characteristic of a modulation circuit which uses the circuit of FIG. 3A and in which a DC offset voltage is large.
Figure 4B:
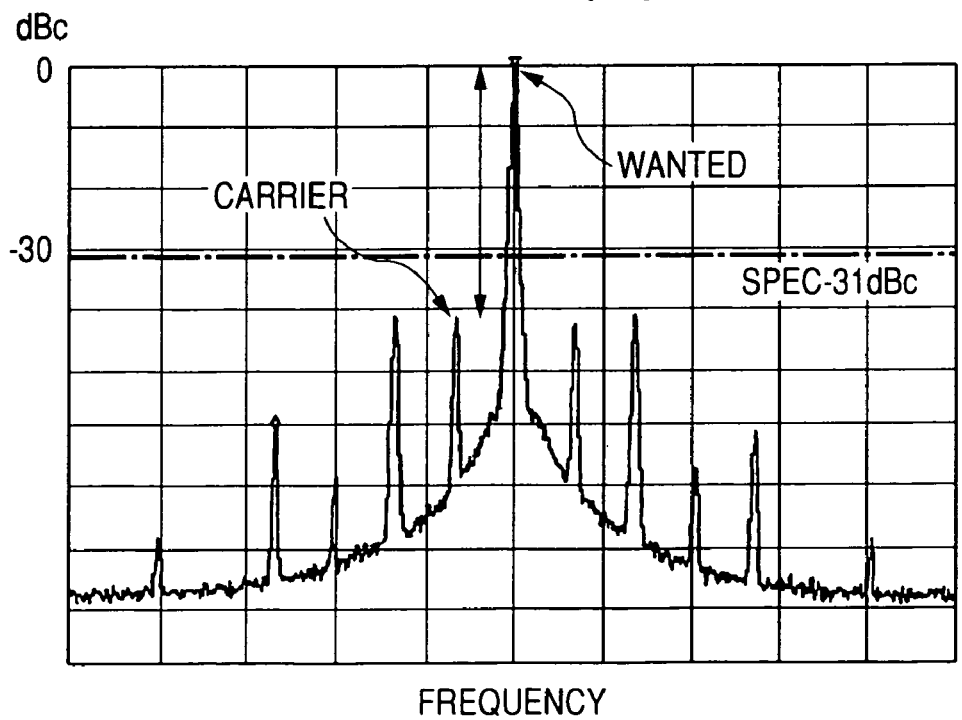
FIG. 4B is a characteristic diagram showing a carrier leak characteristic of a modulation circuit which uses the circuit of FIG. 3B and in which the DC offset voltage is small.

The modulation circuit of the embodiment includes an amplifier (preamplifier) AMP0 in a first stage for amplifying input I and /I signals (or Q and /Q signals), a level shifting circuit DLS for shifting the DC level of the amplified signal, and a mixer circuit MIX taking the form of a differential circuit called a Gilbert circuit. The preamplifier AMP0 and the DC level shifting circuit DLS are formed by circuits as shown in FIG. 3A. The /I signal is a signal whose phase is different from that of the I signal by 180° and the /Q signal is a signal whose phase is different from that of the Q signal by 180°.

Specifically, the preamplifier AMP0 is constructed by input differential MOSFETs Q1 and Q2, MOSFETs Q3 and Q4 for constant current connected in series between source terminals of the MOSFETs Q1 and Q2 and power supply voltage terminals Vcc, a resistor R0 connected between the source terminals of the MOSFETs Q1 and Q2, and resistors R1 and R2 connected between drain terminals of the MOSFETs Q1 and Q2 and the ground GND. The preamp AMP0 outputs a signal obtained by amplifying the potential difference between the input I and /I signals (or Q and /Q signals) from the drain terminals of the MOSFETs Q1 and Q2.

The level shifting circuit DLS is constructed by a MOSFET Q5 and NPN type bipolar transistors Q7 and Q9 which are connected in series between the power source voltage terminal Vcc and the ground GND, and a MOS transistor Q6 and NPN type bipolar transistors Q8 and Q10 which are similarly connected in series between the power source voltage terminal Vcc and the ground GND. A connection node between the MOSFETs Q7 and Q9 and a connection node between the MOSFETs Q8 and Q10 are connected to the drain terminals of the input differential MOSFETS Q1 and Q2 of the preamp AMP0 in the ante stage. Each of the transistors Q7 and Q8 is so-called diode-connected that a base and a collector are coupled. The transistors Q5 and Q6, and the transistors Q9 and Q10 operate as the constant current sources when a predetermined voltage is applied to the gate or base. A signal obtained by shifting up the output of the preamplifier AMP0 in the ante stage only by the base-emitter voltage of the bipolar transistor is output from collectors of Q7 and Q8.

As shown in FIG. 2, the mixer circuit MIX includes: a pair of differential transistors Q11 and Q12 in a lower stage whose emitter terminals are connected to each other via resistors Re1 and Re2 and having base terminals to which I-in and /I-in signals (Q-in and /Q-in signals) shifted by the DC level shifting circuit DLS are input; two pairs of differential transistors Q21 and Q22 and differential transistors Q23 and Q24 in an upper stage whose common emitters are connected to the collector terminals of the transistor Q11 and Q12 and having base terminals to which intermediate frequency signals $\phi$IF1 and /$\phi$IF1 ($\phi$IF2 and /$\phi$IF2) are input; and transistors Q13 and Q14 for constant current and emitter resistors Re3 and Re4 connected between the emitter terminals of the pair of differential transistors Q11 and Q12 in the lower stage and the ground. The collectors of the transistors Q21 and Q23 are coupled to each other and connected to the power source voltage Vcc via a collector resistor Rc1, and the collectors of the transistors Q22 and Q24 are coupled to each other and connected to the power source voltage Vcc via a collector resistor Rc2.

The mixer circuit MIX in FIG. 2 mixes the I-in and /I-in signals as signals input to the differential part in the lower stage and the intermediate frequency signals $\phi$IF1 and /$\phi$IF1 as signals input to the differential part in the upper stage, and outputs signals including signal components corresponding to the frequency sum and the frequency difference of the signals from the common collector of the transistors Q21 and Q23 and the common collector of the transistors Q22 and Q24.

A mixer circuit on the Q signal side which is not shown outputs, as differential signals, signals including signal components corresponding to the frequency sum and the frequency difference of the Q-in and /Q-in signals and the $\phi$IF2 and /$\phi$IF2. The signals $\phi$IF1 and /$\phi$IF1 ($\phi$IF2 and /$\phi$IF2) are orthogonal signals whose phases are shifted from each other by 90°. As the orthogonal signals, signals of a frequency like 80 MHz generated by dividing the frequency of a high-frequency oscillation signal $\phi$RF from a local oscillator 262 by an IF frequency dividing circuit 264, and by further dividing and phase-shifting the resultant signals by a frequency divider and a phase shifter 232 are used.

Further, the modulation circuit of the embodiment is provided with change-over switches S21 and S22 on paths to which the intermediate frequency signals $\phi$IF1 and /$\phi$IF1 ($\phi$IF2 and /$\phi$IF2) from the frequency divider and phase shifter 232 are input so that direct current voltages VL and VH can be applied to the bases of the differential transistors Q21, Q22, Q23, and Q24 in the upper stage in place of the signals $\phi$IF1 and /$\phi$IF1 ($\phi$IF2 and /$\phi$IF2). As the direct current voltages VL and VH, a voltage which can turn off the transistors Q21 and Q24 and a voltage which can turn on the transistors Q22 and Q23 are selected, and a large current is passed to the transistors Q22 and Q23 in the pairs of differential transistors in the upper stage so that input signals of differential transistors Q11 and Q12 in the lower stage can be amplified.

A resistance Re0 for switching gain and on-off switches S23 and S24 are connected in series between the emitters of the pair of differential transistors Q11 and Q12 in the lower stage. A change-over switch S25 for selectively applying a bias voltage Vbias from a not-shown bias generation circuit or a ground voltage is provided for the base terminals of the transistors Q13 and Q14 for constant current.

On the input side of the amplifier (preamplifier) AMP0 in the first stage provided in the ante stage of the Gilbert Cell type mixer circuit MIX having the configuration as described above, switches S26 and S27 for inputting the input I and /I signals (or Q and /Q signals) and switches S28 and S29 for inputting a predetermined direct current voltage Vmcal in place of the I and Q signals are provided. As the direct current voltage Vmcal, a voltage such as 0.625V which is at the same level as that at the time of normal input of the I and /I signals is selected.

The calibration circuit 231 includes: a comparator CMP detecting a potential difference between differential outputs of the mixer circuit MIX; a control logic CTL for performing calibration by controlling the switches S21 to S29 and the like; a DA converter DAC formed by a plurality of constant current sources I1 to I6 and switches S11 to S16 that selectively combine currents of the constant current sources I1 to I6; a change-over switch S10 for selecting, as an output current of the DA converter DAC, any of differential outputs of the level shift circuit DLS. In the constant current sources I1 to I6, current of the constant current source I1 is the largest, and the constant current sources I1 to I6 are weighted with the n-th power of 2 such that I2 is equal to half of I1, and I3 is equal to half of I2.

The control logic CTL is provided with a register REG for holding a 7-bit control code corresponding to an input value of the DA converter DAC. The bit values of the register REG are sequentially set in accordance with an output of the comparator CMP. The constant current sources I1 to I6 and the switches S11 to S16 in series in the DAC, and the change-over switch S10 are on/off controlled according to the control code which is set in the register REG. Concretely, the change-over switch S10 is controlled by the bit "B0" in the control code in the register REG and the switches S11 to S16 in the DAC are controlled by the bits "B1" to "B6", respectively. The control logic CTL may be constructed separate from the control logic 260 in FIG. 1 or integrally with the control logic 260.

Next, the calibration operation of the modulation circuit of the embodiment will be described with reference to FIG. 5. A predetermined command that instructs start of a transmission mode is sent from the baseband circuit 300 to the control logic CTL (260). The command is decoded by the control logic CTL and control signals are sequentially generated. By the control signals, calibration is sequentially executed. In the embodiment, the command is called "Word 3".

When the calibration of the modulation circuit starts, first, the control logic CTL holds a control signal IQSW_ON at the low level and sets the switches S26 and S27 into the off state. In a state where input of the I and /I signals and the Q and /Q signals is prohibited, a control signal IQMOD_ON is set to the high level to activate the modulation circuit 233a on the I side and the modulation circuit 233b on the Q side. By a control signal MCAL_ON, the comparator CMP is activated and the switches S28 and S29 are set into the on state. The same direct current voltages Vmcal are applied to differential input terminals of the preamplifier AMP0, so that the offset of the preamplifier and subsequent circuits appears in an output (timing t7 in FIG. 5).

Subsequently, a calibration control signal ICAL_ON on the I side is set to the high level, and the switches S21 and S22 are switched to apply the direct current voltages VL and VH in place of the intermediate frequency signals φIF1 and /φIF1 to the differential transistors in the upper stage of the mixer circuit MIX. The switches S23 and S24 are also set to the on state so that the resistor Re0 is connected between the emitter terminals of the differential transistors in the lower stage. As a result, the gain of the mixer circuit MIX is set to be high. The switch S25 of the mixer circuit MIX on the I side is set so that bias voltage Vbias is applied to the bases of the transistors Q13 and Q14 for constant current. The switch S25 of the mixer circuit MIX on the Q side is set so that the ground potential GND is applied to the bases of the transistors Q13 and Q14 for constant current (timing t71 in FIG. 5). It makes the mixer circuit MIX on the Q side inactive and only an output according to the offset of the modulation circuit 233a on the I side is input to the comparator CMP.

After that, the control logic CTL determines the states of the switches S1 to S16 in the DA converters DAC with reference to the output of the comparator CMP. Concretely, first, the control code bits B0 to B6 in the register REG are set to "0" to turn off all of the switches S11 to S16 so that current of the DA converter DAC does not flow from the level shifting circuit DLS. In a state where the switch S10 is connected on the side of the /Iin signal, the output of the comparator CMP is determined.

When it is assumed that an output of the comparator CMP is at high level, the electric potential of the I-in signal in the differential outputs Iin and /Iin of the level shifting circuit DLS is higher. Consequently, the control bit B0 of the register REG corresponding to the switch S10 is set to "1" to change the switch S10 to the opposite Iin signal side. Next, the control bit B1 of the resistor REG corresponding to the switch S11 connected in series to the current source I1 having the largest current among the current sources I1 to I6 of the DAC is set to "1" to turn on the switch S11. By the operation, the output electric potential of the I signal in the differential outputs in the DC level shifting circuit DLS is decreased.

In this state, the output of the comparator CMP is determined again. When it is assumed that the output of the comparator CMP is at the high level, the electric potential of the I signal in the DC level shifting circuit DLS is still higher. Therefore, in a similar manner to the control bit B0, the control bit B1 holds "1" and the switch 11 maintains the on state.

At the next time, the control bit B2 of the resister REG corresponding to the switch S12 connected in series to the current source I2 having the second largest current among the current sources I1 to I6 in the DAC is set to "1" to turn on the switch S12. By the operation, the output electric potential on the I signal side in the differential outputs of the DC level shifting circuit DLS is further decreased.

When it is assumed that the output of the comparator CMP is at the low level in the second determination, it means that the electric potential of the I-in signal in the DC level shifting circuit DLS becomes lower. Therefore, the control bit B2 of the register REG is reset to "0" to set the switch S12 to the off state, and the state of the control bit B2 is held continuously.

After that, the control bits B3 to B6 of the register REG are similarly sequentially set to "1" to turn on the switches S 13 to S16. When the output of the comparator CMP is at the high level, the control bit is held at "1". When the output is at the low level, the control bit is set to "0" and held. By such operations, the states of all the control bits B0 to B6 of the resister REG are set. The electric potential of the I-in signal becomes closer to that of the /I-in signal only by the sum of the switches which are on among the current sources I1 to I6 of the DAC, so that the offset voltage as the potential difference between the Iin signal and the /I-in signal decreases.

In the case where the electric potential on the /I-in signal side is high in the stage of the timing t71 in FIG. 5, the control bit B0 is held at "0". Subsequently, the calibration is performed so that the electric potential on the /I-in signal side becomes closer to that of the I-in signal, and the offset voltage decreases.

At the time point when the setting of the control bit B6 is finished, the control signal ICAL_ON is set to the low level and the calibration of the modulation circuit on the I side is finished (timing t72 in FIG. 5). In the last setting state, the input DC offset of the mixer circuit MIX in the post stage is the smallest. Therefore, the state of the register REG is held as it is until the next calibration is executed.

Next, a calibration control signal QCAL_ON on the Q side is set to the high level to apply the direct current voltages VL and VH to the upper stage of the mixer circuit MIX on the Q side, and the switch S25 in the mixer circuit MIX on the Q side is set so that the bias voltage Vbias is applied to the bases of the transistors Q13 and Q14 for constant current (timing t73 in FIG. 5). By a procedure similar to that of the I side, the calibration of the modulation circuit on the Q side is executed. The bits of the register REG corresponding to the DA converter on the Q side are set, the control signal QCAL_ON is set to the low level, and the calibration of the modulation circuit on the Q side is finished (timing t74 in FIG. 5).

Concurrently, the control signal MCAL_ON is set to the low level to turn off the switches S28 and S29 so that the direct current voltage Vmcal is not applied to the modulation circuits 233a and 233b on the I and Q sides. After lapse of predetermined time, the control signal IQSW_ON is set to the high level to turn on the switches S26 and S27 so that each of the I and /I signals and the Q and /Q signals can be input to the preamplifier AMP0 (timing t75 in FIG. 5). After further lapse of predetermined time, the I and /I signals (or Q and /Q signals) are input to the preamplifier AMP0 from the baseband circuit and transmission starts (timing t76 in FIG. 5). Even when transmission starts, the DA converter DAC is in the operation state. Thus, modulation which is not influenced by the DC offset of an input circuit such as the preamplifier AMP0 can be realized.

Figure 7:
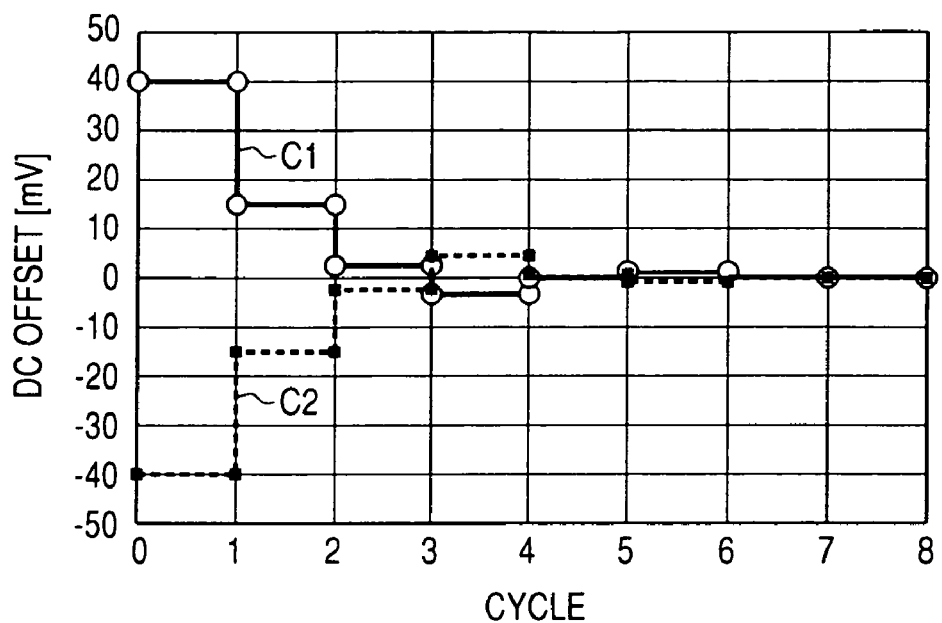
FIG. 7 is an explanatory diagram showing an example of a change in a DC offset in the calibrating operation of the modulation circuit of the embodiment.

FIG. 7 shows an example of transition of the output voltage (MOD_OUT) of the mixer circuit MIX on the I signal side at the time of the calibration operation. Solid line C1 shows the voltage on the I signal side and broken line C2 shows the voltage on the /I signal side. The control bit B0 in the operation description is set in the cycle from 0 to 1 in the horizontal axis. The control bit B1 is set in the cycle from 1 to 2, and the control bit B2 is set in the cycle from 2 to 3. In such a manner, the control bits are sequentially set and the control bit 6 is set in the cycle 7. The cycle 0 corresponds to the timing t71 in FIG. 5 and the cycle 7 corresponds to the timing t72. In the cycle 7 and subsequent cycles, the minimum level of the offset voltage is held.

Figure 8:
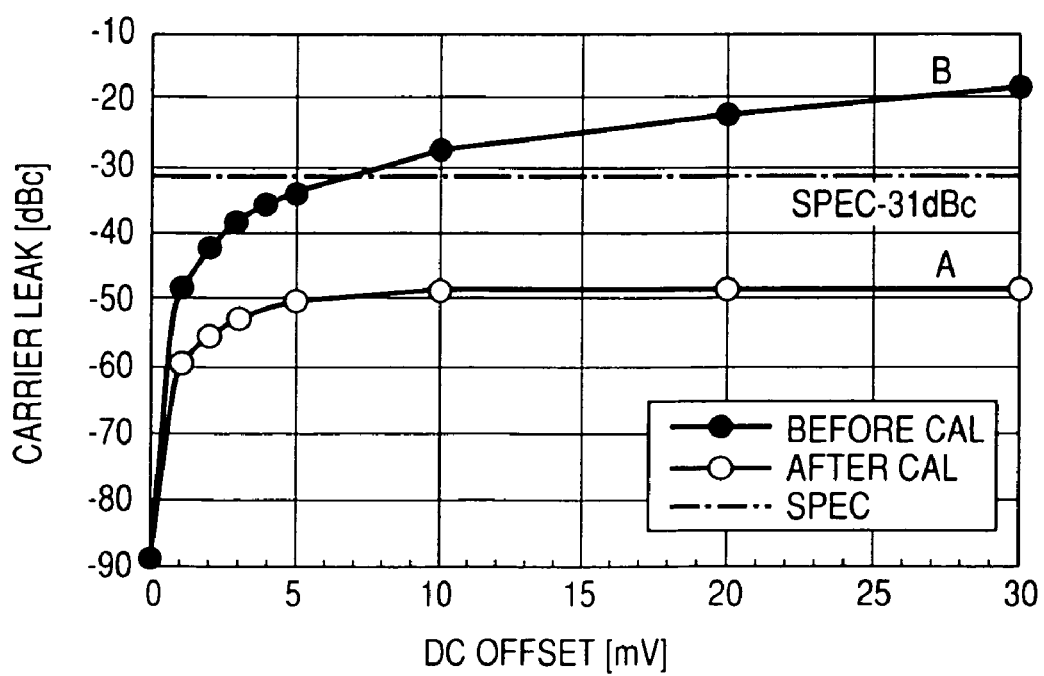
FIG. 8 is a graph showing the relation between the DC offset voltage and a carrier leak before and after application of the calibration circuit of the embodiment.

FIG. 8 shows carrier leak characteristics of the modulation circuit before and after the calibration is performed.

In FIG. 8, A denotes the carrier leak characteristic after the calibration and B denotes the carrier leak characteristic before the calibration. From FIG. 8, it is understood that although the carrier leak exceeds −31 dBc at 7.5 mV or more of the DC offset before the calibration, the carrier leak after the calibration is suppressed to −40 dBc or less and does not exceed −31 dBc at which the transmission characteristic deterioration occurs.

Next, the flow of the whole mode control including the calibration operation in the RF IC of the embodiment will be described by using the timing chart of FIG. 6.

When the power supply of the system is turned on, power supply to the RF IC 200 starts. After turn-on of the power supply, for example, a command "Word 4" that instructs reset of the inside is supplied from the baseband IC 300 to the RF IC 200. By the command, circuits such as the register in the RF IC are reset by the control circuit 260, and the RF IC enters an idle mode (sleep mode in which the RF IC waits for a command) (timing t1 in FIG. 6).

Figure 6:
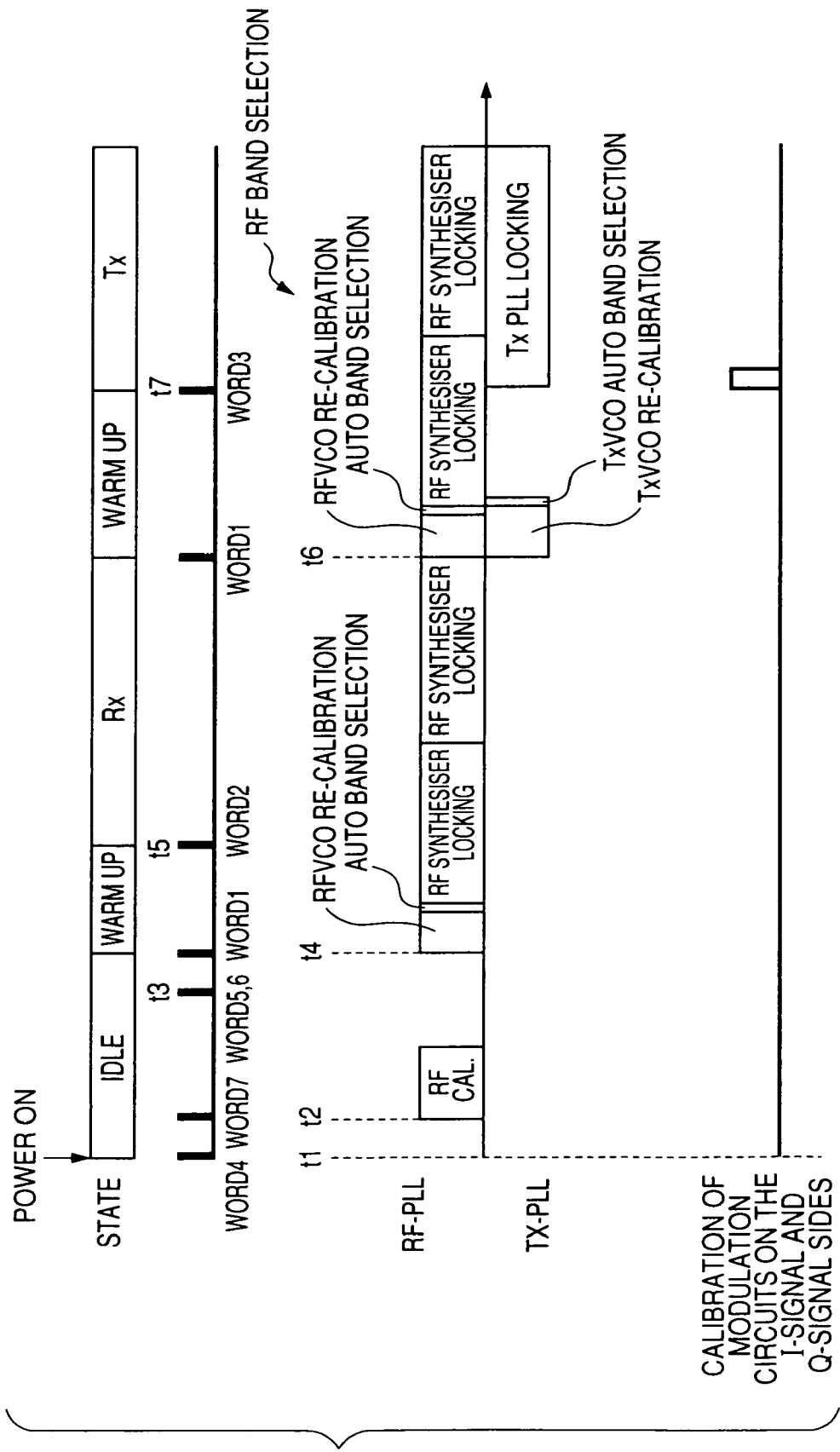
FIG. 6 is a timing chart showing the procedure of mode control in the RF IC of the embodiment, calibration of RX-PLL and TX-PLL circuits, calibration of the modulation circuit.

When a command "Word 7" including a predetermined bit or code instructing the calibration of VCO is supplied from the baseband IC during the idle mode "Idle", calibration processing (measurement and storage of frequency) of the RFVCO and TXVCO in the RF IC is performed (timing t2 in FIG. 6).

After lapse of proper time after transmission of the measurement start command "Word 7", the baseband IC sends commands "Word 5" and "Word 6" instructing initial setting (timing t3 in FIG. 6). When measurement of the frequency of TXVCO is finished, the finish is notified to the control circuit. After completion of the measurement, the control circuit initially sets the inside of the RF IC for transmission/reception operation.

After completion of the initial setting, a command "Word 1" including frequency information of a channel to be used is supplied from the base band IC to the RFIC. The control circuit enters a warm-up mode "Warm up" for starting up VCO (timing t4 in FIG. 6). The command "Word 1" includes a bit instructing transmission or reception. At the time of reception according to the bit, re-calibration is performed on the RFVCO, and an operation of selecting a use band of the RFVCO (262) is performed on the basis of the frequency information from the baseband. The RFVCO is allowed to oscillate and an RF synthesizer 263 is set to a lock state.

After that, when the command "Word 2" instructing receiving operation is transmitted from the baseband IC, a reception mode "Rx" is set, the reception-related circuit RXC is operated, and a reception signal is amplified and demodulated (timing t5 in FIG. 6).

When the reception mode "Rx" is finished, the command "Word 1" including frequency information is supplied from the baseband IC 300 to the RF IC 200, and the control circuit 260 enters again the warm-up mode "Warm up" of starting the VCO (timing t6 in FIG. 6). When the bit instructing transmission or reception in the command instructs transmission, re-calibration is performed on the RFVCO and TXVCO and, after that, the operation of selecting a use band of the RFVCO and TXVCO on the basis of the frequency information from the baseband IC is performed. After determining the band, the RF synthesizer 263 is set to the lock state.

Subsequently, the command "Word 3" instructing start of the transmission mode is transmitted from the baseband IC 300 to the RF IC 200. When the "Word 3" is received, the control circuit 260 enters the transmission mode, prepares transmission by calibration of the modulation circuits 233a and 233b by the calibration circuit 231 of the embodiment, sets a transmission loop TXPLL to the lock state, and modulates and amplifies a transmission signal (timing t7 in FIG. 6). Each of the reception mode "Rx" and the transmission mode "Tx" is executed in a time unit called time slot (for example, 577 μsec).

As described above, the calibration of the modulation circuits 233a and 233b in the RF IC of the foregoing embodiment can be finished in extreme short time. Consequently, the calibration can be executed without slowing transmission operation of GSM or hindering transmission.

Finally, the RF IC 200 in FIG. 1 will be described in detail. The RF IC 200 is constructed so as to be able to modulate/demodulate signals in the four frequency bands of GSM850, GSM900, DCS1800, and PCS1900. The filters 420a, 420b, 420c, and 420d according to the respective frequency bands are provided on the reception side.

The reception-related circuit RXC includes: low noise amplifiers 210a, 210b, 210c, and 210d for amplifying reception signals in the frequency bands of the PCS, DCS, and GSM; a frequency divider and phase shifter 211 which divides the frequency of a local oscillation signal φRF generated by an RF oscillator (RFVCO) 262 which will be described later to generates orthogonal signals whose phases are shifted from each other by 90°; mixers 212a and 212b for performing demodulation and down-conversion by mixing the orthogonal signals generated by the frequency divider and phase shifter 211 with reception signals amplified by the low noise amplifiers 210a, 210b, 210c, and 210d; high-gain amplification parts 220A and 220B which amplify the demodulated I, Q signals and output the amplified signals to the baseband circuit 300; and a gain control and calibration circuit 213 for controlling gain of amplifiers in the high-gain amplification parts 220A and 220B and cancelling an input DC offset. The reception-related circuit RXC of the embodiment employs a direct conversion method of converting a reception signal directly to a signal in the frequency band of the baseband.

The control-related circuit CTC includes: the control circuit (control logic) 260 for controlling the whole chip; a reference oscillator (DCXO) 261 for generating an oscillation signal φref as a reference; the radio frequency oscillator (RFVCO) 262 as a local oscillator for generating a radio frequency oscillation signal φRF for converting frequency; the RF synthesizer 263 which constructs a PLL circuit in cooperation with the RF oscillator (RFVCO) 262; the frequency dividing circuit 264 which divides the frequency of the oscillation signal φRF generated by the RFVCO 262, modulates transmission signals, and generates an intermediate frequency signal φIF necessary for up-conversion of the first stage; frequency dividing circuits 265 and 266 for dividing the frequency of the oscillation signals φRF and generating signals necessary for frequency conversion of feedback signals in the PLL circuit for transmission; and mode change-over switches SW1 and SW2.

To the control circuit 260, a clock signal CLK for synchronization, a data signal SDATA, a load enable signal LEN as a control signal are supplied from the baseband circuit 300. When the load enable signal LEN is asserted to a valid level, the control circuit 260 sequentially receives the data signal SDATA transmitted from the baseband circuit 300 synchronously with the clock signal CLK and generates a control signal in the chip in accordance with a command included in the data signal SDATA. Although not limited, the data signals SDATA are transmitted in series.

The transmission-related circuit TXC includes: the frequency divider and phase shifter 232 for further dividing the intermediate frequency signal φIF of 160 MHz or the like generated by dividing the frequency of the oscillation signal φRF generated by the RFVCO 262 by the frequency dividing circuit, thereby generating orthogonal signals whose phases are shifted from each other by 90°; the modulation circuits 233a and 233b for modulating the generated orthogonal signals with the I and Q signals supplied from the baseband circuit 300; an adder 234 for adding the modulated signals; a transmission oscillator (TXVCO) 240 for generating a transmission signal φTX of a predetermined frequency; a down-convert mixer 235 for mixing a feedback signal obtained by extracting a transmission signal φTX output from the transmission oscillator (TXVCO) 240 by couplers 280a and 280b and the like and attenuating the signal by an attenuator ATT with a signal φRF' obtained by frequency-dividing the radio frequency oscillation signal φRF generated by the RF oscillator (RFVCO) 262, thereby generating a signal of a frequency corresponding to the frequency difference between the signals; a phase detector 236 for detecting the phase difference by comparing an output of the mixer 235 with a signal TXIF obtained by addition of the adder 234; a loop filter 237 for generating a voltage according to an output of the phase detector 236; a frequency divider 238 for frequency-dividing an output of the transmission oscillator (TXVCO) 240, thereby generating a GSM transmission signal; and buffer circuits 239a and 239b for transmission output.

The transmission-related circuit of the embodiment employs an offset PLL method of orthogonal-modulating transmission I and Q signals with an intermediate-frequency carrier wave, mixing a feedback signal from the output side of the TXVCO 240 with the signal φRF' obtained by frequency-dividing the RF oscillation signal φRF of the RFVCO 262, thereby down-converting the I, Q signals to a signal of an intermediate frequency corresponding to the frequency difference and, after that, comparing the phase of the resultant signal with the phase of the signal subjected to the orthogonal modulation, thereby controlling the TXVCO 240 in accordance with the phase difference. An output of the down-convert mixer 235 is supplied to the phase comparator 236 through a path in the GSM mode of GMSK modulation and a path in the EDGE mode of 8PSK modulation, which are different from each other.

To switch the paths, switches SW3 and SW4 are provided. For the signal path in the GSM mode, a buffer BFF1, a low-pass filter SLPF1, and a buffer BFF2 are provided. For the signal path in the EDGE mode, a variable gain amplifier MVGA, a low-pass filter MLPF2, a limiter LIM2, and a low-pass filter LPF3 are provided. To supply the output of the down-convert mixer 235 via any of the path in the GSM mode of the GMSK modulation and the path in the EDGE mode of the 8PSK modulation to the phase detector 236, a switch SW5 is provided which switches the paths for supplying a transmission signal of an intermediate frequency obtained by adding signals subjected to orthogonal modulation in the mixers 233a and 233b by the adder 234. In the EDGE mode, the transmission signal is supplied to the phase detector 236 via a limiter LIM1 and a low-pass filter LFP4.

Further, the transmission-related circuit TXC of the embodiment has an amplitude control loop including: an amplitude comparing circuit 244 for detecting the amplitude difference by comparing the output of the down-convert mixer 235 with the transmission signal obtained by adding signals orthogonal-modulated by the mixers 233a and 233b by the adder 234 in order to perform amplitude control in the EDGE mode; a loop filter 245 for band-limiting the output of the amplitude comparing circuit 244; a variable gain amplifier (IVGA) 246 for amplifying the band-limited signal; a voltage-current converting circuit 247 for converting the amplified voltage of the amplitude control loop into current; a level shifting circuit 248; and a filter 249 for converting the current to a voltage. The transmission-related circuit TXC is constructed so that amplitude modulation can be performed in parallel with phase modulation.

Figure 9:
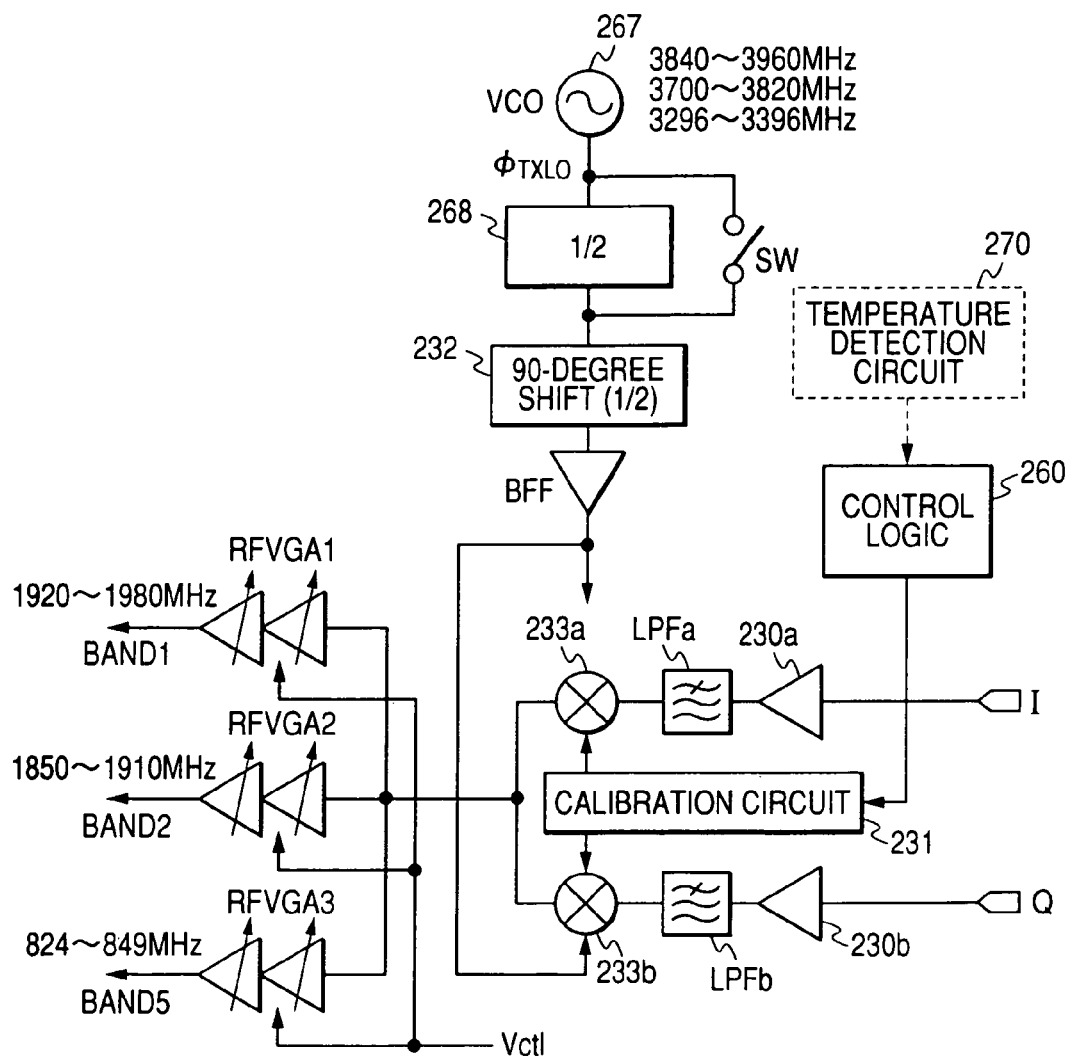
FIG. 9 is a block diagram showing a configuration example of a transmission circuit of the RF IC as a component of a system capable of performing radio communication in the WCDMA using the modulation circuit of the embodiment having the DC offset calibration circuit.

Next, a configuration example of the transmission-related circuit in the RF IC as a component of a system capable of performing radio communication in the WCDMA using the modulation circuit having the DC offset calibration circuit will be described with reference to the FIG. 9.

The transmission-related circuit of the embodiment includes: an oscillator 267 for generating a local oscillation signal φTXL0 for transmission; a frequency divider 268 for dividing the frequency of the generated oscillation signal φTXL0; the frequency divider and phase shifter 232 for dividing the frequency of the oscillation signal φTXL0 or the signal subjected to the frequency division in the frequency divider 268 to generate orthogonal signals whose phases are shifted from each other by 90°; a buffer BFF for buffering the frequency-divided and phase-shifted signal; amplifiers 230a and 230b for amplifying I and Q signals input from the baseband circuit; low-pass filters LPFa and LPFb for removing higher harmonics; the modulators 233a and 233b for adding the signals transmitted from the frequency divider and phase shifter 232 and the input I and Q signals, and concurrently performing orthogonal modulation and up-conversion; the calibration circuit 231 for canceling a DC offset in the modulators 233a and 233b; and linear variable amplifiers RFVGA1, RFVGA2, and RFVGA3 for amplifying the modulated signal in accordance with an output level instruction signal Vct1 supplied from the baseband circuit.

The modulators 233a and 233b are formed as modulation circuits of a direct up-conversion type capable of converting the I and Q signals in the frequency band of the base band directly into signals in the transmission frequency. The transmission-related circuit of the embodiment is constructed as a triple-band transmission-related circuit capable of handling a 1920-1980 MHz band (band 1), a 1850-1910 MHz band (band 2), and a 824-849 MHz band (band 5).

Therefore, the oscillator 267 for generating the local oscillation signal φTXL0 generates the oscillation signal φTXL0 of 3840-3960 MHz, 3700-3820 MHz, and 3296-3396 MHz in accordance with the bands. In the band 5 of low frequencies, a switch SW bypassing the frequency divider 268 is turned off, the frequency of the signal φTXL0 is divided by four, and the resultant signals are supplied to the modulators 233a and 233b. In the bands 1 and 2 of high frequencies, the switch SW is turned on to make the signal φTXL0 bypass the frequency divider 268, the frequency of the signal φTXL0 is divided by two, and the resultant signals are supplied to the modulators 233a and 233b.

FIG. 10A shows the timings of calibration in the modulators 233a and 233b at the time of transmitting signals in the GSM. FIG. 10B shows the timings of calibration of the modulators 233a and 233b at the time of transmitting signals in the WCDMA in the transmission-related circuit of FIG. 9. In FIG. 10A, "Rx" denotes a reception slot and "Tx" denotes a transmission slot. The GSM is, as known, the TDMA in which transmission and reception are separately performed in a time division manner. On the other hand, in a radio communication of the WCDMA, transmission and reception are performed in parallel. Therefore, as shown in FIG. 10B, the calibration is executed only once before star of transmission.

In the GSMA, as described above, for example, a circuit may be constructed so that calibration is performed on the basis of a command instructing start of transmission. In this case, as shown in FIG. 10A, calibration is performed just before each of the transmission slots "Tx".

Although the present invention achieved by the inventors herein has been described concretely on the basis of the embodiment, the invention is not limited to the foregoing embodiment. For example, a temperature detection circuit 270 may be provided as shown by the broken line in FIG. 9. After calibration is performed once, the calibration can be performed only in the case where a transmission start command is received from the baseband circuit and the temperature becomes a predetermined temperature or higher. Alternately, a calibration execution flag or counter may be provided in the control logic 260, and calibration is executed every other transmission start command or every predetermined number of transmission start commands.

In the embodiment of FIG. 1, the intermediate frequency signal φIF to be added with the transmission I and Q signals by the mixers 233a and 233b for orthogonal modulation is generated by frequency-dividing the oscillation signal φRF generated by the RFVCO 262 by the frequency divider 264 for IF. Alternately, a PLL circuit including a VCO and a synthesizer for generating the intermediate frequency signal φIF may be provided to generate the intermediate frequency signal φIF.

In the above description, the present invention achieved by the inventors herein is applied to the modulation circuit for transmission in the RF IC used for a radio communication system such as a cellular phone in the field of utilization as the background of the invention. However, the invention is not limited to the embodiment but can be also applied to not only the RF IC for a wireless LAN but also a circuit for performing frequency conversion or modulation/demodulation of a reception signal and a transmission signal.

What is claimed is:

1. A semiconductor integrated circuit for communication comprising:
    a modulation circuit having a mixer for generating a transmission signal by mixing a baseband signal for transmission and a carrier wave signal; and
    a calibration circuit that detects a potential difference of differential outputs in a state where potentials at both input terminals of the modulation circuit are controlled to be equal to each other and the mixer is blocked so that the carrier wave signal is not input, and changes potentials of differential inputs of the mixer on the basis of the detection result, thereby reducing the potential difference.

2. A semiconductor integrated circuit for communication according to claim 1, wherein detection of the potential difference and reduction of the potential difference by the calibration circuit are executed in response to a predetermined command supplied from the outside.

3. A semiconductor integrated circuit for communication according to claim 1,
    wherein transmission is performed in the unit of a frame formed of a plurality of time slots which are continuous in time, and detection of the potential difference and reduction of the potential difference by the calibration circuit are executed in a period of preparing transmission of a transmission time slot in the frame.

4. A semiconductor integrated circuit for communication according to claim 3,
    wherein detection of the potential difference by the calibration circuit is performed in the first half of the period of preparing transmission of the transmission time slot, and reduction in the potential difference based on a detection result is performed in the latter half of the transmission preparation period.

5. A semiconductor integrated circuit for communication according to claim 3,
    wherein the modulation circuit comprises:
    a first mixer that mixes a first transmission baseband signal of a first phase component and a carrier wave; and
    a second mixer that mixes a second transmission baseband signal of a component orthogonal to the first phase component with a carrier wave, and
    wherein detection of the potential difference of differential outputs of the first mixer and detection of the potential difference of differential outputs of the second mixer by the calibration circuit are performed in order in a time division manner during the period of preparing transmission of the transmission time slot.

6. A semiconductor integrated circuit for communication according to claim 3,
    wherein in the case where a plurality of time slots for transmission are included in the frame, detection of the potential difference and reduction in the potential difference by the calibration circuit are executed in each of periods of preparing transmission of the plurality of time slots for transmission.

7. A semiconductor integrated circuit for communication according to claim 1, further comprising a demodulation circuit having a mixer that mixes a reception signal with a carrier wave to generate a baseband signal for reception,
    wherein the modulation circuit and the demodulation circuit operate simultaneously so that a transmitting process and a receiving process can be performed in parallel, and detection of the potential difference and reduction in the potential difference by the calibration circuit are executed only once prior to the transmitting/receiving processes.

8. A semiconductor integrated circuit for communication according to claim 1, wherein the modulation circuit comprises:
    an amplifier in a first stage for amplifying differential input signals;
    a DC level shifting circuit for shifting DC level of the amplified signal; and
    a mixer that mixes the shifted signal with the carrier wave to generate a transmission signal, and
    wherein the amplifier in the first stage includes a Metal Oxide Semiconductor Field Effect Transistor and an NPN bipolar transistor.

9. A semiconductor integrated circuit for communication according to claim 8,
    wherein the mixer comprises a pair of differential transistors in a lower stage and two pairs of differential transistors in an upper stage serially connected to transistors of the pair of transistors in the lower stage between a first power supply voltage terminal and a second power supply voltage terminal,
    wherein a baseband signal for transmission is input to input terminals of the pair of differential transistors in the lower stage, carrier wave signals whose phases are shifted from each other by 90° can be input to input terminals of the two pairs of differential transistors in the upper stage, and
    wherein, at the time of detecting the potential difference by the calibration circuit, input of the carrier wave signals is prohibited, a first direct current voltage is applied to an input terminal of a transistor of one of the two pairs of differential transistors in the upper stage, and a second direct current voltage higher than the first direct current voltage is applied to an input terminal of the other transistor.

10. A semiconductor integrated circuit for communication according to claim 9,
wherein the mixer is constructed so as to be able to switch gains, and at the time of detecting the potential difference by the calibration circuit, a gain is set to be higher than a gain which is set when the baseband signal for transmission and the carrier wave signal are input and modulation is performed.

* * * * *